United States Patent

Mrugala

[15] 3,700,226

[45] Oct. 24, 1972

[54] PRESSURIZED UNIVERSAL HOLDING DEVICE

[72] Inventor: Joseph V. Mrugala, Kenmore, N.Y.

[73] Assignee: Sylvania Electric Products Inc.

[22] Filed: Sept. 24, 1970

[21] Appl. No.: 75,079

[52] U.S. Cl. .............269/22, 29/203 B, 269/321 WE

[51] Int. Cl. ............................B23q 3/08, H05k 3/30

[58] Field of Search......269/21, 22, 321 W, 321 WE; 29/203 B

[56] References Cited

UNITED STATES PATENTS

| | | | |
|---|---|---|---|
| 1,872,692 | 8/1932 | Drake | 269/22 |
| 3,568,754 | 3/1971 | Geiger | 269/22 X |
| 3,294,392 | 12/1966 | Dunham | 269/21 |
| 3,307,818 | 3/1967 | Cocito | 269/21 X |
| 2,396,413 | 3/1946 | Egger | 72/465 |
| 2,519,661 | 8/1950 | Johnson | 93/59 CE |

*Primary Examiner*—Robert C. Riordon
*Assistant Examiner*—Neil Abrams
*Attorney*—Norman J. O'Malley, Elmer J. Nealon and Robert T. Orner

[57] ABSTRACT

A device for holding components against one surface of a printed circuit board includes a base plate having an opening therein and adapted to support the printed circuit board with the components. A cover has a flexible diaphragm mounted to the periphery of the cover walls to form a closed chamber therewith. The cover with the diaphragm is clamped to the base plate with the diaphragm adjacent to the unsecured components on the printed circuit board. Air, introduced into the closed chamber through a valve in the wall of the cover, deforms the flexible diaphragm about the components forcing them against the printed circuit board.

3 Claims, 3 Drawing Figures

INVENTOR.
JOSEPH V. MRUGALA
BY
ATTORNEY

INVENTOR.
JOSEPH V. MRUGALA
BY Robert T. Orner
ATTORNEY

PRESSURIZED UNIVERSAL HOLDING DEVICE

BACKGROUND OF THE INVENTION

This invention relates to holding devices, in particular to a universal holding device useful, for example, in holding unsecured electrical components to one surface of a printed circuit board while the leads of the components are being secured to the other surface of the board.

In preparing a circuit board and mounting electrical components thereon, the board is provided with conductive paths and a plurality of holes at selected locations in contact with selected paths. The components are placed on one side of the board with their leads extending through the holes to the other side.

Present assembly methods include insertion of the components' leads one at a time by hand with an operator holding the component and turning the board over for cutting, bending and soldering of the leads. A second method includes drawing a sheet of heat sealable plastic over the board to hold the unsecured components in place when cutting and bending the leads.

The disadvantages of the first method are obvious. One disadvantage of the second method is the time and cost of going through the process of drawing the plastic sheet over the components and the subsequent removal thereof.

It would, therefore, be advantageous to have and it is one of the objects of this invention to provide a low cost reusable device for holding the unsecured components to one or more printed circuit boards during the securing operation.

SUMMARY OF THE INVENTION

A device for holding elements disposed on a mounting member, such as a printed circuit board, includes a base plate adaptive to support the mounting member on one surface thereof. A cover, the walls of which define a cavity, has a flexible diaphragm mounted along the periphery of the walls so as to form a closed chamber therewith. An attaching means clamps the cover with the diaphragm mounted thereto to the base plate such that the diaphragm is adjacent to the unsecured elements. A fluid is introduced into the closed chamber through a means, such as a valve, to deform the flexible diaphragm about the elements. Thus, the force exerted by the fluid on the elements via the deformed flexible diaphragm holds the elements against one surface of the mounting member.

DESCRIPTION OF THE DRAWINGS

The construction and operation of the pressurized holding device will be more fully understood from the following detailed description taken in conjunction with the accompanying drawings in which.

DETAILED DESCRIPTION OF THE INVENTION

Figure 1:
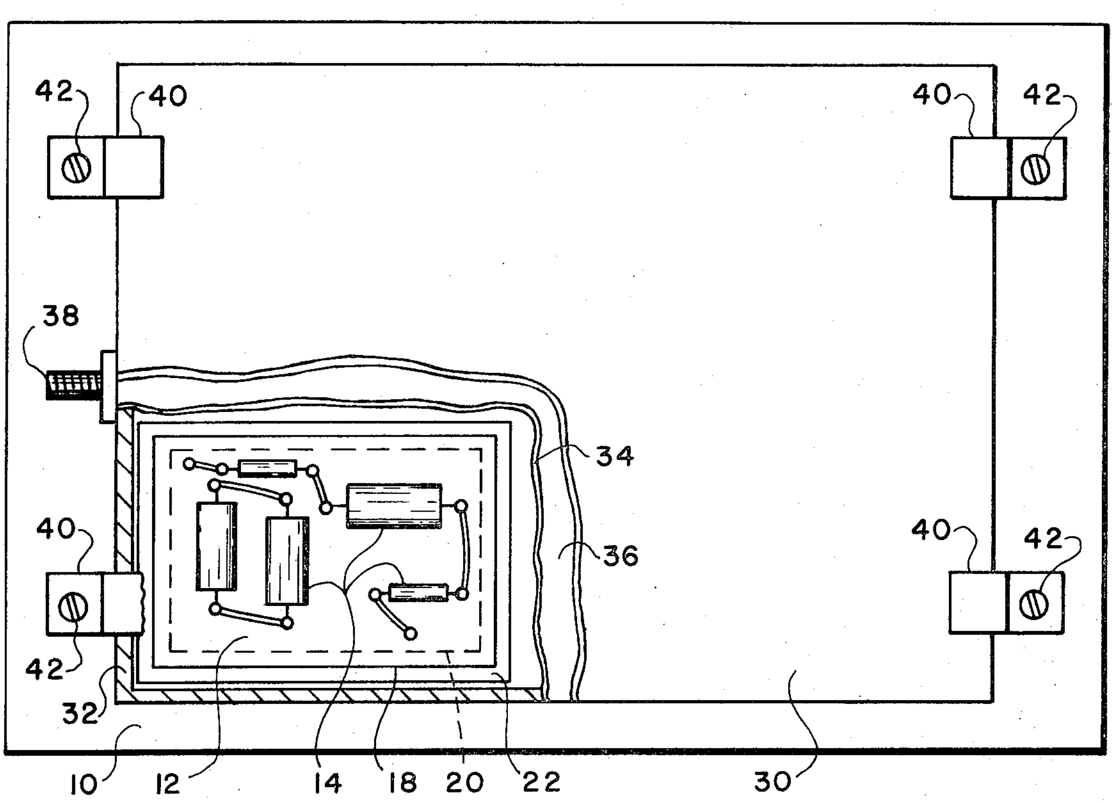
FIG. 1 is a top plan view, partly cut away, of the device according to the invention.
Figure 2:
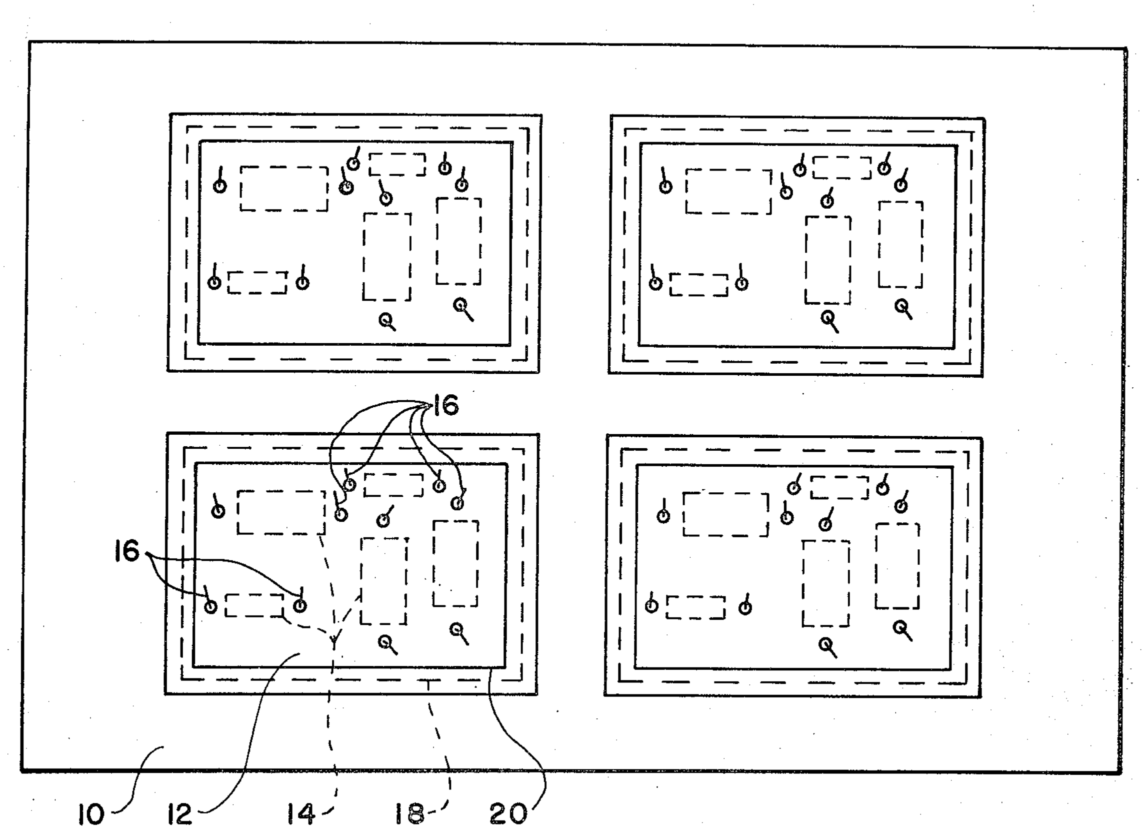
FIG. 2 is a bottom plan view of the device according to the invention.

A partially cutaway plan view and a bottom plan view of an embodiment of a pressurized holding device according to the present are shown, respectively, in FIGS. 1 and 2. The holding device includes a base plate 10 having openings therein over which a mounting member, for example, a printed circuit board 12, is supported. Disposed on the printed circuit board 12 is a plurality of elements, for example, the electrical components 14. The leads 16 of the electrical components 14 extend through holes in the printed circuit board 12 as shown in the bottom view of FIG. 2.

The outer edge 18 of the printed circuit board 12 is larger than the periphery 20 of the opening in the base plate 10 such that the base plate supports the printed circuit board 12. The base plate 10 has a channel 22 running substantially adjacent to the outer periphery 18 of the printed circuit board 12.

A cover 30, the walls of which define a cavity, has a flexible diaphragm 34 suspended across the cavity and attached to the walls 32 of the cover 30 so as to form a closed chamber 36 between the diaphragm 34 and the cover 30. An inlet, such as a valve 38, is adapted to couple a fluid such as air into the closed chamber. The cover 30 along with the flexible diaphragm mounted thereto is fixed to the base plate by any well-known devices, such as the clamps 40 and their respective screws 42.

Figure 3:
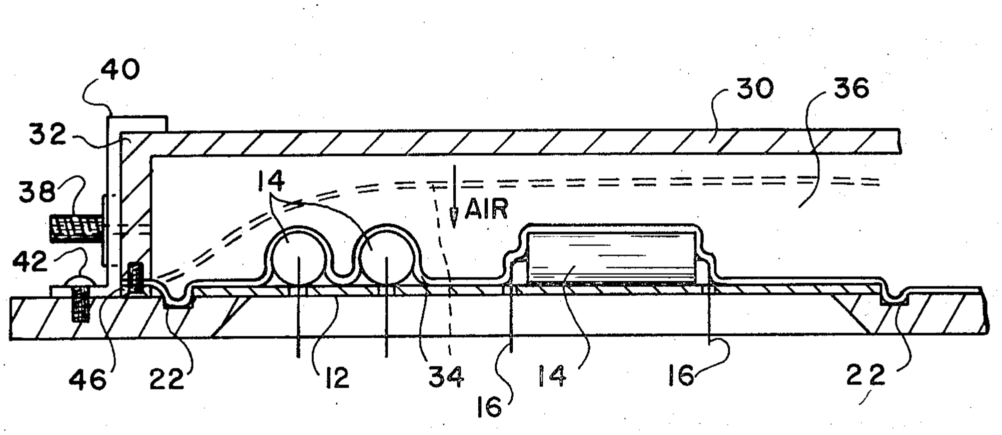
FIG. 3 is an exploded partial sectional side view of the device according to the present invention.

The exploded cutaway sectional view shown in FIG. 3 will be employed to explain the operation of the pressurized holding device according to the invention. The electrical components 14 are disposed on the printed circuit board 12 with their respective leads 16 extending through the holes in the boards. The printed circuit board 12 is then placed over the opening 20 in base plate 10. The cover 30 with the flexible diaphragm 34 attached thereto is fixed to the base plate 10 by the clamps 42, and air is introduced into the closed chamber 36 through the valve 38.

The dashed lines in FIG. 3 show a typical position of the flexible diaphragm 34 before air is introduced into the closed chamber 36, and the solid lines show the position of the flexible diaphragm after deformation by the air. Portions of the flexible diaphragm 34 are deformed into the channel 22 circumventing the printed circuit card 12 to prevent lateral motion of the card during processing.

The flexible diaphragm 34 is attached to the periphery of the walls 32 by any well-known means. For example, the periphery of the diaphragm can be sandwiched between the edge of the wall 32 and a flat ring 46 and held in position by a series of screws 46, one of which is shown in FIG. 3.

By employing for the valve 38 an air valve similar to that used in automobile tires, the air source may be removed after filling and the pressurized holding device placed in any position for further processing or, if need be, even transported from station to station in an assembly line.

While there has been shown and described what is considered a preferred embodiment of the present invention, various modifications and changes may be made therein without departing from the invention as defined in the appended claims.

What is claimed is:

1. A moveable device for holding components in fixed relationship on a surface of a circuit board comprising:

a moveable base member having an opening therein and being adapted to support the circuit board over said opening;

a cover having walls defining a cavity;

a flexible diaphragm;

means for mounting said flexible diaphragm to the periphery of the walls of said cover to form a closed chamber therewith;

means for attaching said cover with said diaphragm mounted thereto to said base plate such that said diaphragm is adjacent to said components;

means for introducing a fluid into said chamber to exert pressure on said flexible diaphragm;

said flexible diaphragm being adapted in response to said pressure to deform about the components and the circuit board to thereby hold said components in fixed relationship against said circuit board and said board against said base plate with a portion of the board exposed at said opening whereby the position of the device can be changed while the fixed relationship of the components to the board remains unchanged.

2. A device according to claim 1 wherein said base member further includes a channel along the outer edge of the circuit board whereby said flexible diaphragm deforms into said channel preventing lateral movement of said board on said base plate.

3. A device according to claim 1 wherein said fluid is air and said means for introducing a fluid includes an air valve mounted to the walls of said cover and having one end extending into said closed chamber.

* * * * *